United States Patent [19]
Harvey et al.

[11] Patent Number: 6,150,071
[45] Date of Patent: Nov. 21, 2000

[54] FABRICATION PROCESS FOR FLEX CIRCUIT APPLICATIONS

[75] Inventors: Paul M. Harvey; William V. Dower, both of Austin, Tex.; William V. Ballard, Tokyo, Japan

[73] Assignee: 3M Innovative Properties Company, St. Paul, Minn.

[21] Appl. No.: 09/173,325

[22] Filed: Oct. 15, 1998

[51] Int. Cl.[7] ....................................................... G03F 7/00
[52] U.S. Cl. ............................................. 430/312; 216/47
[58] Field of Search ................................ 430/9, 311, 312, 430/314, 319; 216/47

[56] References Cited

U.S. PATENT DOCUMENTS

| | | | |
|---|---|---|---|
| 3,415,699 | 12/1968 | Brown | 156/13 |
| 3,448,098 | 6/1969 | Gaines et al. | 260/211.5 |
| 3,469,982 | 9/1969 | Celeste | 96/35.1 |
| 3,526,504 | 9/1970 | Celeste | 96/35.1 |
| 3,867,152 | 2/1975 | Priem et al. | 96/63 |
| 4,853,317 | 8/1989 | Hayes | 430/318 |
| 5,137,791 | 8/1992 | Swisher | 428/612 |
| 5,334,487 | 8/1994 | Kindl et al. | 430/312 |
| 5,637,426 | 6/1997 | Uchikawa | 430/9 |
| 5,719,749 | 2/1998 | Stopperan | 361/769 |

FOREIGN PATENT DOCUMENTS

| | | | |
|---|---|---|---|
| 0568841 A1 | 11/1993 | European Pat. Off. | G03F 1/00 |
| 1233401 | 5/1971 | United Kingdom | H05K 3/06 |
| 2117670 | 10/1983 | United Kingdom | G03F 7/02 |

*Primary Examiner*—John Goodrow
*Attorney, Agent, or Firm*—Darla P. Fonseca

[57] ABSTRACT

The invention provides a process for fabricating a flexible printed circuit with at least one etched or plated feature on each major surface of said flexible circuit, comprising the steps of providing an input material with two major surfaces, including a dielectric substrate and at least one conductive base layer, laminating a photoresist with a cover sheet onto at least one major surface of the input material, and printing an image onto the cover sheet or removing the coversheet and printing the image onto the photoresist directly.

16 Claims, 5 Drawing Sheets

FABRICATION PROCESS FOR FLEX CIRCUIT APPLICATIONS

BACKGROUND OF THE INVENTION

1. Field of the Invention

The invention is a process for fabricating electronic interconnect circuits, such as flexible circuits having etched or plated features on both sides of a dielectric substrate, especially IC packaging and tape ball grid array type (TBGA) circuits.

2. Description of the Related Art

Conventional imaging and exposure techniques used in producing fine pitch flexible circuits require the use of a discrete photomask which has opaque regions which define the image that will be exposed on the circuit substrate. Registration and exposure using a discrete photomask is a slow process due to the mechanics associated with indexing the web as the mechanism which holds the photomask is opened and closed. Circuit configurations requiring two side imaging require near exact alignment between the features on the opposing sides of the substrate. An imaging process using discrete photomasks requires that the two photomasks be in hinged relation to each other such that they can be moved away from the web to allow for the indexing of the web. This opening and closing operation is an operation that can contributes to misalignment between the images on the two sides of the substrate as there is typically no active alignment system used to verify registration.

U.S. Pat. No. 5,637,426 discloses a method for forming a resist pattern on substrates such as a printed circuit boards, semiconductor substrates, and transparent glass or plastic substrates. The patterned resist layer can be used for defining features such as circuitry layers or solder resist patterns. The method entails forming a resist layer on an object, placing a transparent mask substrate on the resist covered object, establishing a mask pattern directly on the transparent mask substrate with an ink jet printer, exposing the resist to light with intervention of the mask, removing the transparent mask substrate, and then developing the resist. The use of an ink jet printer and the absence of two side processing of circuits in the process of Uchikawa are key departures from the present invention. No means or utility relating to the formation or processing of features residing on opposing faces of an object, is disclosed. In particular, Uchikawa makes no mention of a means for registering mask patterns which are formed on opposing sides of a circuit substrate. Similarly, no method is disclosed for meeting registration requirements between dependent features residing on opposing sides for ensuring that acceptable electrical performance is obtained. A key limitation in the claims of Uchikawa is that the substrate being processed has a plurality of through holes. In the case of a circuit, this would mean that the Uchikawa process is not being used to produce the through holes.

U.S. Pat. No. 4,853,317 discloses a method for serializing printed or flexible circuit boards utilizing an ink jet printer. The method is stated to be useful in that it allows individual boards to be serialized with unique indicia, but without requiring a separate photomask or printing plate for each desired serialization. The method entails providing a flexible or printed circuit board, printing serialization information directly onto the photoresist layer, placing a photomask with a circuit patterning image over the photoresist, irradiating the photoresist and finally developing the photoresist. The use of an ink jet printer and the absence the two side processing of circuits in the process of Hayes are key departures from the present invention. As with Uchikawa, for image resolutions required for practical utility of the present invention, ink jetters are known to be incapable of imaging at rates comparable to the mask pattern producing means of the present invention. Furthermore, no means for two side processing is taught nor suggested nor does the utility (serialization) disclosed inherently require two side processing.

In view of the above, and because the speed for conventional imaging is approximately 0.30 to 1 meter/minute, it would be desirable for a process to allow high speed fabrication and two side processing.

The process of the current invention utilizes image patterning and exposure sequence steps having higher speed than are currently possible with conventional pattern imaging and exposure techniques. This high speed patterning and exposure results in reduced manufacturing cost and the ability to economically manufacture smaller quantity production runs. The process is applicable to both additive and subtractive fabrication processes.

In the present invention, a high speed printing method such as gravure, flexographic, or offset is used for producing a desired image directly on the coversheet of a photoresist clad dielectric substrate, or alternatively, to print directly on the photoresist itself. This type of patterning format is distinctly different from conventional imaging where a discrete photomask is used for generating the pattern. Rather than the pattern being provided on a transparent substrate such as glass, the image is printed with ink on the photoresist or on the polymeric substrate on which the photoresist is supplied.

When image exposure and development are done in continuous process with the printing, the combined speed of printing and imaging for the present invention is from approximately 1.8 to about 3 meters per minute. However, the exposure speed is limited by the sensitivity of the photoresist and the intensity of the light source. Depending on the type of light source and sensitivity of the photoresist, exposure rates are approximately 0.05 meters/second to about 0.16 meters/second. Thus, the imaging is the rate-limiting step, i.e., if the processes are not combined, independent high speed printing rates are much faster. The printing rates for the various high speed printing methods mentioned can be as high as 46 meters/minute.

SUMMARY OF THE INVENTION

The invention provides a process for fabricating a flexible printed circuit with at least one etched or plated feature on each major surface thereof, comprising the steps of:
 (a) providing an input material including a dielectric substrate and at least one conductive base layer, the input material having two major surfaces,
 (b) laminating a photoresist having a cover sheet thereover onto at least one major surface of the input material,
 (c) removing the cover sheet, and
 (d) printing an image directly onto the photoresist.

The invention also provides a process for fabricating a flexible printed circuit with at least one etched or plated feature on each major surface of said flexible circuit, comprising the steps of:
 (a) providing an input material including a dielectric substrate and at least one conductive base layer, said input material having two major surfaces,
 (b) laminating a photoresist onto at least one major surface of said input material, said photoresist having a cover sheet thereover, and (c) printing an image onto said cover sheet.

As used herein, these terms have the meanings below.

1. The term "photomask", if present, means a photoresist and its cover sheet.

2. The term "photoresist" means photosensitive material that resists the effects and the chemicals used in subsequent process.

All percents, parts and ratios herein are be weight unless specifically noted otherwise.

DETAILED DESCRIPTION OF THE INVENTION

FIGS. 1 to 7 illustrate the preferred embodiments of the present invention when employed in an additive circuit fabricating process. In an additive process, circuit traces are built-up onto the input material 1 in the desired pattern. FIGS. 8 to 14 illustrate the preferred embodiments of the present invention when employed in a subtractive process. In a subtractive process, circuit traces are formed by removing areas of a continuous layer of conductive material from the input material 1. The regions where the conductive layer 22 is removed forms the desired circuit trace pattern.

Figure 1:
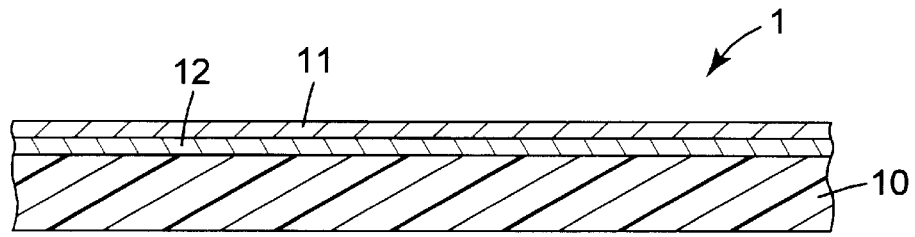
FIG. 1 shows a perspective view of the input material for the process.

The input material 1 shown in FIG. 1 includes a dielectric substrate 10, a metal oxide layer 12 on at least one side of the dielectric substrate and a conductive base layer 11 on the metal oxide layer 12. The metal oxide layer 12 is known in the art to increase adhesion between the dielectric substrate 10 and the conductive base layer 11. The dielectric substrate 10 is preferably a fully cured polymeric material, including such films as polyesters, e.g., poly(ethylene terephthalate), polycarbonates and polyimide. Polyimides are preferred polymeric films, including unmodified polyimides as well as modified polyimides such as polyester imides, polyimide-imide-esters, polyamide-imides, polysiloxane imides and other mixed imides. Especially preferred is a polyimide polymer made from the anhydride of pyromellitic acid and 4,4diamino-diphenyl ether, available as Kapton® from E.I. DuPont de Nemours, Inc (DuPont). Variations of such material are available as Kapton™ E, Kapton™ V, and Kapton™ H. Similar materials are available under the tradenames Pyralin™, also from DuPont, and Apical™, the latter being available from Kaneka Chemical Industries. Typically, the input material has a thickness of from about 35 micrometers to about 125 micrometers.

The methods for forming the metal oxide layer 12 include but are not limited to sputtering and chemical vapor deposition; useful methods also include thermal evaporation. The preferred material for formation of the metal oxide layer 12 is chromium. Other materials that may also be used include iron, nickel, manganese, molybdenum zirconium and mixtures thereof.

Figure 2:
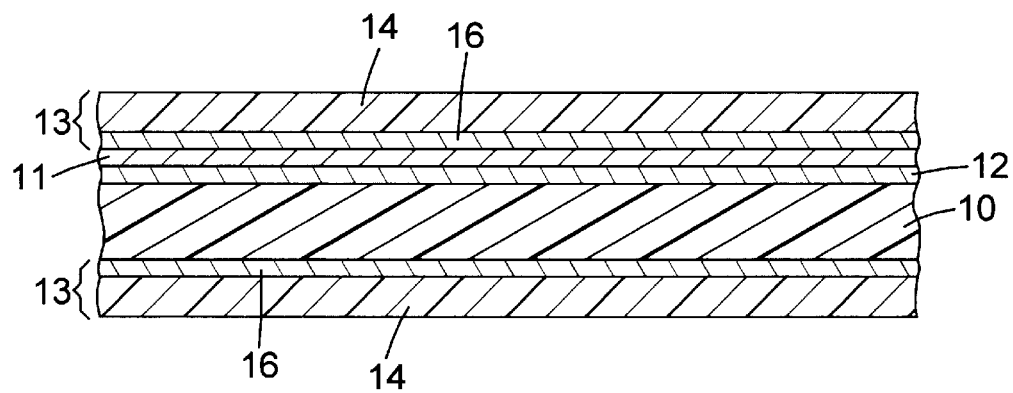
FIG. 2 shows a perspective view of the input material which photoresist layers and coversheets laminated to each side.

FIG. 2 shows a photomask sheet 13 laminated to both sides of input material 1. Typically, the photomask sheet 13 will be laminated under heat and pressure, using standard laminating techniques. The photomask sheet 13 consists of a photoresist layer 16 which is sensitive to radiation of a specific wavelength and a polymeric coversheet 14 which is transparent to radiation of the specified wavelength. Useful photoresists include negative photoresists such as negative aqueous processing polymerizable photohardenable compositions such as those disclosed in U.S. Pat. Nos. 3,469,982, 3,448,098, 3,867,152, and 3,526,504, all of which are incorporated herein by reference. Such photoresists include at least one polymeric material, additional crosslinkable monomers and a photoinitiator. Examples of polymers include acrylic and methacrylic copolymers, and copolymers of (meth)acrylates with styrene and maleic anhydride. Examples include, but are not limited to a polymethyl methacrylate polymer available under the trade name Riston™ from DuPont, those available from Hercules as Aquamer™ SF series 313, 120 and 125, and CF series and those available from Hitachi as Phototec™.

Figure 3:
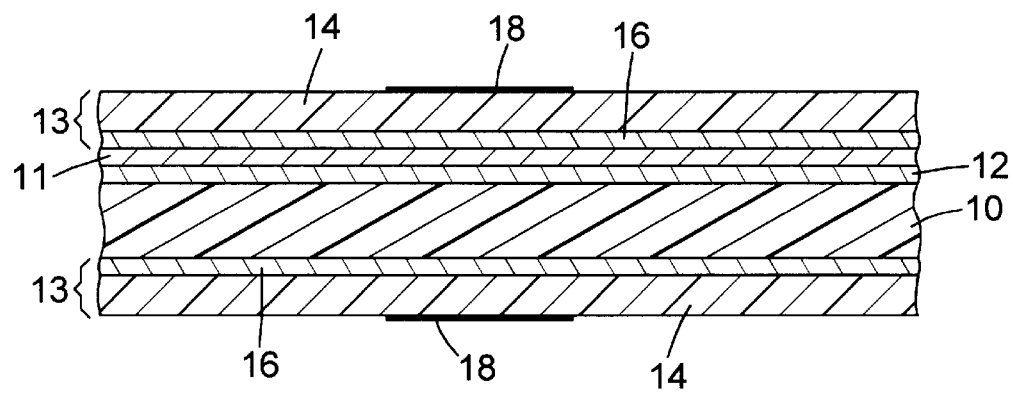
FIG. 3 shows a perspective view of the material from FIG. 2 with photomasks placed on the coversheets.

Following lamination of photomask sheet 13, a mask pattern 18 as shown in FIG. 3 is printed directly onto both coversheets 14. The printing methods utilized include gravure, flexographic, and offset printing techniques. The specific printing technique selected will be based at least partially on the resolution, registration, and cost requirements of a particular circuit design.

The various printing techniques have strengths and weaknesses which recommend them for use in certain applications. Flexographic and letterpress offer low cost and short "make-ready" times, but lesser quality than some printing methods. In addition, letterpress and to a lesser degree flexographic printing methods will subject the photoresist substrate to a non-uniform force in the printing nip. This may cause pressure induced defects. As these types of printing are usually not "high end", registration may need to be upgraded for these techniques to be used for this invention on the current generation of commercially available presses.

Offset lithography provides a uniform pressure, a higher quality image, and perhaps a higher top speed, with a longer make-ready time. Rotary gravure printing offers high line speeds and the longest runs, a very fine image quality, particularly for the line work which will be important for electronics, but requires very expensive cylinder preparation, and slow set up time.

Waterless lithography offers the benefits of offset, with a further improvement in image quality, but the selection of inks is currently somewhat limited.

Ink jet and xerographic approaches are typically of low image quality, not well suited for critical line work, and not configured for double sided registration. They would not be considered, except for very low quality work which required the ability to do extremely short runs, or to prepare individual single samples, and finally silk screen printing cannot produce the line art image quality which would generally be required.

The mask pattern 18 is formed of opaque regions of ink that block the radiation to prevent it from acting on the photoresist layer 16. The open regions allow the radiation to pass through the coversheet and act on the photoresist layer 16. The configuration of the mask pattern 16 defines the design of the resulting circuit. Because the coversheets 14 are later removed, there is very little risk of contamination of the developing solution from the inks.

Inks to be used in the invention vary depending upon the exact printing technique selected, the drying technique selected and the substrate. However, it is important to minimize particles and debris in the ink in order to minimize defects. If it is desired to print directly on the photoresist, the ink must be selected such that it will not interfere with the development of the photoresist. Typical additives for use with an aqueous based photoresist development technique would include acid containing monomers or oligomers.

Exposing the photoresist layer 16 on the two sides of the dielectric substrate 10 to radiation of the specified wavelength initiates a chemical reaction in the photoresist layer 16. This chemical reaction results in a pattern identical to the mask pattern to be formed in the photoresist layer 16. Following removal of the coversheets 14, the photoresist layer 16 can be developed in a solution of developer.

Figure 4:
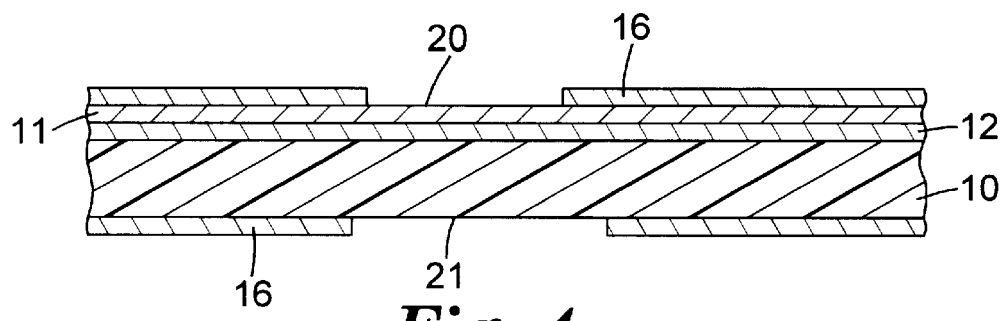
FIG. 4 shows a perspective view of the material after irradiation and development of the photoresist layer.

Exposure of the photoresist layer 16 is typically a "step and repeat" type of process, in which a certain number of articles are moved into a chamber where they are exposed to adequate radiation, and Exposing the photoresist layer 16 on the two sides of the dielectric substrate 10 to radiation of the specified wavelength initiates a chemical reaction in the photoresist layer 16. This chemical reaction results in a pattern identical to the mask pattern to be formed in the photoresist layer 16. Following removal of the coversheets 14, the photoresist layer 16 can be developed in a solution of developer. As shown in FIG. 4, upon exposure to radiation of the specified wavelength and to the required develop solution, the regions of the photoresist layer 16 (negative acting) which were covered by the opaque regions of the mask pattern 18 are selectively removed by the develop solution, producing exposed regions 20 and 21. The exposed regions 20 and 21 can be subjected to subsequent etching and/or plating process steps to produce the desired circuit features. These features generally include conductive circuit traces and conductive or non-conductive through holes.

All of the figures show a negative acting photoresist layer 16 which is sensitive to radiation of the wavelength which passes through coversheet 14. Alternately, a positive acting photoresist material could be used, providing the opaque regions and open regions of the mask pattern 18 are inverted. Upon exposing and developing a positive acting photoresist material, the regions of the photoresist material 16 which were not under the opaque portions of the mask pattern 18 would be removed by the develop solution.

Figure 5:
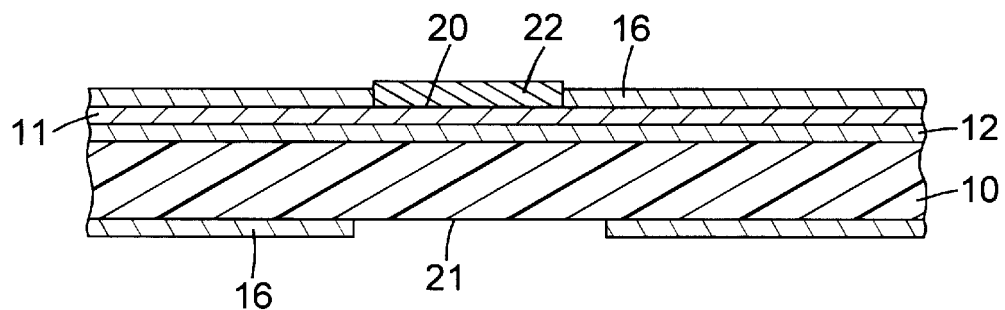
FIG. 5 shows a perspective view of the flexible circuit after the circuit layer has been formed.

The circuit layer 22 can be formed on the surface of the dielectric substrate 10 at exposed region 20 where the photoresist layer 16 has been developed. Preferably, the circuit layer 22 is formed by electroplating. As shown in FIG. 5, electroplating will result in the circuit layer being formed only on the side of the dielectric substrate which has the conductive base layer 11 exposed. The conductive base layer 11 acts to initiate metallic material to be attracted as an electrical current is established between the conductive base layer 11 and the solution of a plating bath. Various types of electroplating apparatus and processes are known in the art; any conventional method may be used.

Figure 6:
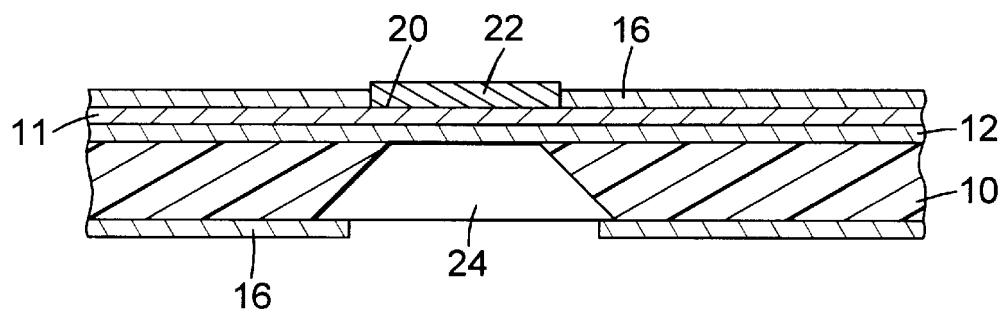
FIG. 6 shows a perspective view of the dielectric substrate layer with a through hole formed therein.
Figure 7:
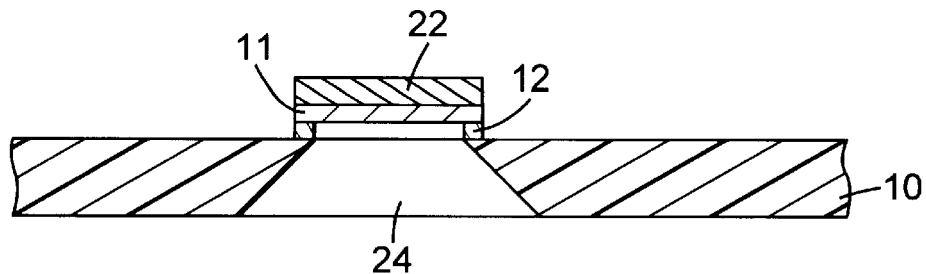
FIG. 7 shows a perspective view of the final flexible circuit after the conductive base layer is etched.

FIG. 6 shows the formation of a through hole 24 in the dielectric substrate 10 at the exposed region 21. While circuits of the invention will typically have at least one through hole, blind vias, i.e., vias which are not etched through the substrate, can also be employed. Depending on the type of method used to form the through holes 24, the walls may be sloped as shown or substantially parallel to each other. Following formation of the through holes, as shown in FIG. 7, the remaining photoresist layer 16 is stripped and the conductive base layer is etched to prevent shorting between the individual traces of circuit layer 22. The metal oxide layer 12 at the base of the through hole 24 is also typically removed. A variety of etchants may be used which do not harm the polymeric film, e.g., Perma-etch™, available from Electrochemicals, Inc. Chemical etching typically produces sloped side walls and requires a photomask to define the desired pattern A photomask that is stable in the chemical milling solution prevents the entire dielectric substrate from being dissolved.

Other methods for forming vias, through holes and the like such as laser ablation will typically produce walls that are substantially parallel but still require the use of a mask to define the locations of the through holes 24. Other methods of forming vias and the like such as mechanical etching and using a Yttrium-Aluminum-Garnet or "YAG" laser to forming through holes 24 without the use of a mask may also be employed where desired.

Figure 8:
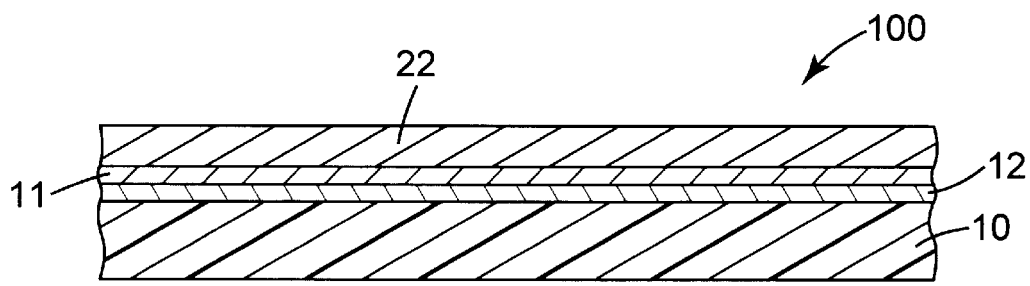
FIG. 8 shows a perspective view of the input material for the alternative subtractive process.

Depending on the requirements of the circuit, an alternate additive process for producing the circuit could be employed. This process would entail leaving the coversheet 14 on the through hole side of the circuit in place until after the circuit layer is formed. Leaving the coversheet in place until this stage of the process would protect the underlying photoresist layer 16 from damage due to physical or chemical interactions. This process sequence would require a second develop step to develop the photoresist layer 16 to enable formation of the through holes 24. As shown in FIG. 8, the input material 100 includes a dielectric substrate 10, a metal oxide layer 12 on at least one side of the dielectric substrate, a conductive base layer 11 on the metal oxide layer 12 and an unpatterned circuit layer 22. In the embodiment shown in FIG. 8, the circuit layer 22 would preferably be formed by electroplating.

Figure 9:
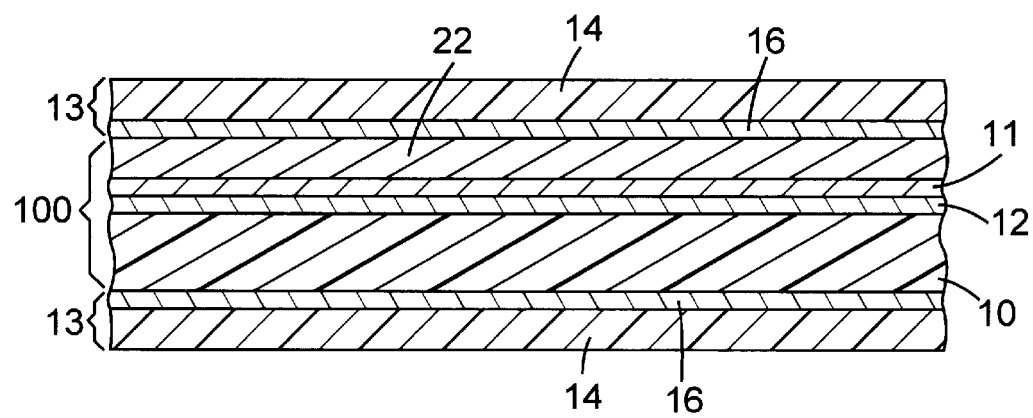
FIG. 9 shows a perspective view of the input material with photomask sheets laminated thereto for the second process.
Figure 10:
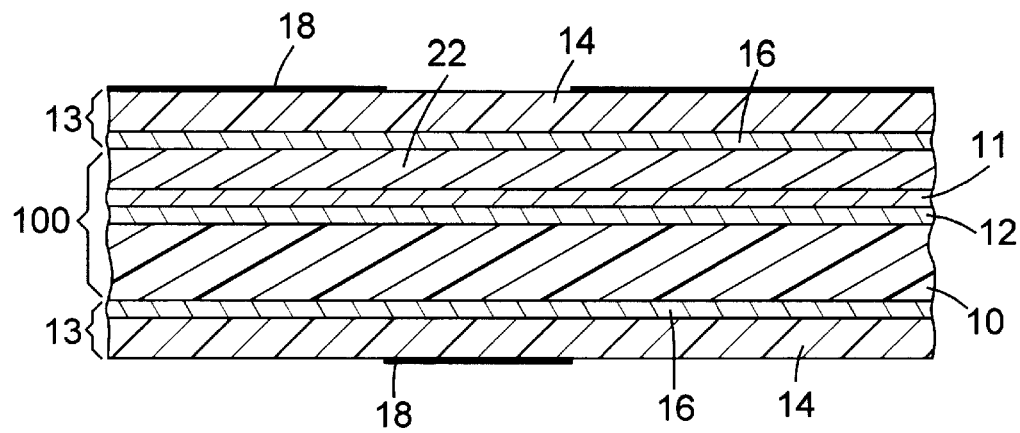
FIG. 10 shows a perspective view of the material from FIG. 9 with photomasks placed on the coversheets and printed.

FIG. 9 shows the lamination of a photomask sheet 13 to each side of input material 100. This step of the process is the same as for an additive process. In a subtractive process, the mask pattern 18 which forms the trace pattern in circuit layer 22 is inverted relative to that used for a additive process. The mask pattern 18 in FIG. 10 on the circuit layer 22 side of the dielectric substrate 10 differs from that in FIG. 3 in that the opaque regions of the mask pattern 18 are in the areas where it is desired to have no circuit layer 22. Regardless of whether a positive acting or negative acting photoresist material is employed, the opaque regions of mask pattern 18 for forming the circuit traces in a subtractive process will be inverted from the opaque regions as used in an additive process. The inversion of the opaque regions of the trace side mask pattern 18 result in the pattern of the developed trace side photoresist also being inverted.

Figure 11:
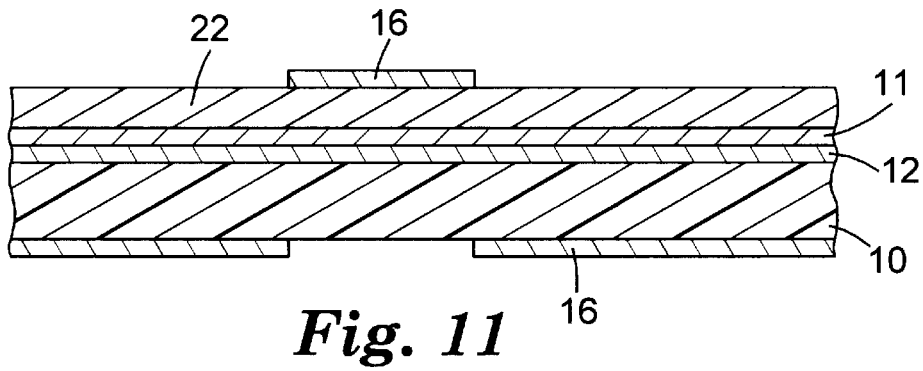
FIG. 11 shows a perspective view of the material after irradiation and development of the photoresist layer.
Figure 12:
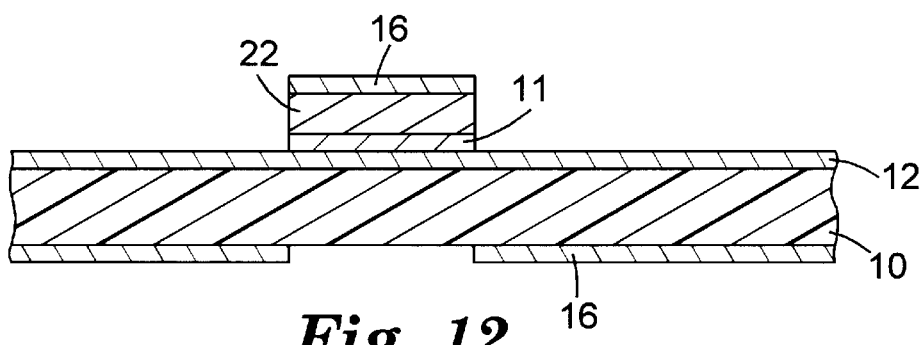
FIG. 12 shows a perspective view of the flexible circuit after the circuit layer has been formed and the conductive base layer etched.
Figure 13:
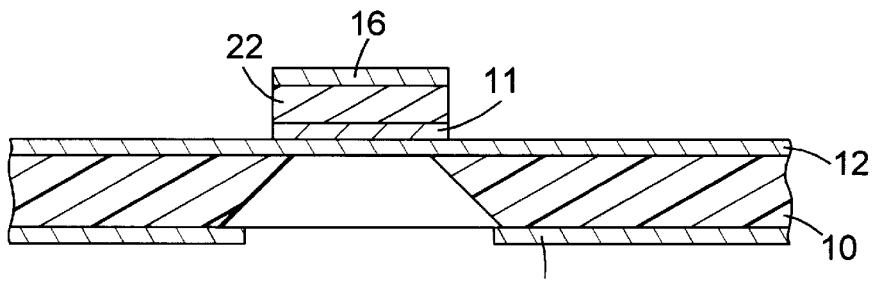
FIG. 13 shows a perspective view of the dielectric substrate layer with a through hole formed therein.
Figure 14:
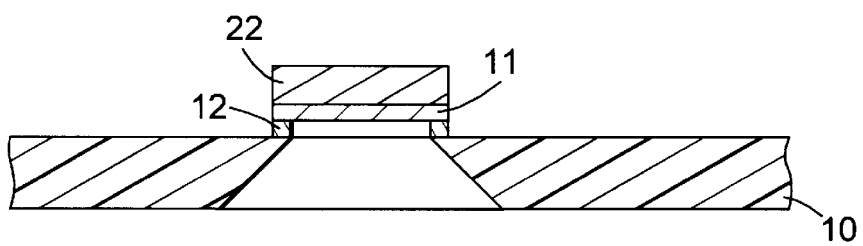
FIG. 14 shows a perspective view of the flexible circuit after the photoresist layer has been stripped.

For a subtractive process, the mask profile as shown in FIG. 11, prior to etching, results in the undesired regions of the circuit layer 22 being etched away to produce the desired trace pattern shown in FIG. 12. Note that the exposed portion of conductive base layer 11 shown in FIG. 11 is also etched away (FIG. 12). As shown in FIG. 13, the formation of the through holes 22 is undertaken in a subtractive process in the same fashion as in an additive process. Following formation of the through holes 22, the photoresist layer 16 is removed. The metal oxide 12 at the base of the through hole 24 is also typically removed. The resulting circuit as shown in FIG. 14 is substantially the same as the circuit shown in FIG. 7.

Figure 15:
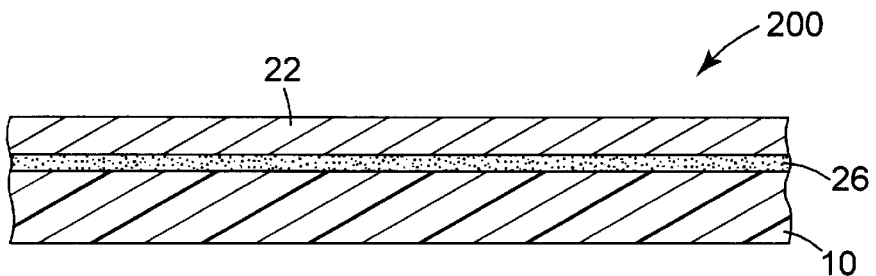
FIG. 15 shows a perspective view of an input material having an adhesive layer construction.

The input material 200 shown in FIG. 15 may also be used in a subtractive process. A circuit layer 22 is bonded to dielectric substrate 10 using an adhesive layer 26. Typically, a thin sheet of copper foil is employed as the material for circuit layer 22. The use of an input material 200 as shown in FIG. 15 will necessitate changes in the selected fabrication process steps. Depending on the adhesive used, the key difference will be that an alternate the process step or etching solution will be need to remove the adhesive from the base of the through holes 24.

Figure 16:
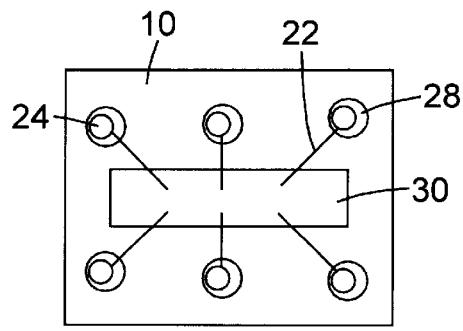
FIG. 16 shows a face view of a flexible circuit with pad to through hole alignment.

The alignment of a pad region 28 to an adjacent through hole 24 is critical to adequate circuit performance and manufacturability. As shown in FIG. 16, the pad region 28 must completely overlap the through hole 24. Meeting the alignment requirement is accomplished by sizing the through hole 24 and pad region 28 such that overlap is maintained for the registration capability attainable with the pattern printing technique chosen. In some cases, the printing equipment will maintain alignment by gear driven rollers. In other cases where more precision is required, closed loop registration systems capable of monitoring and adjusting registration on-line are used.

In an alternative process, which may be either substractive or additive, after lamination of the photomask, the cover sheet is stripped, and the image is printed directly onto the photoresist. The photoresist would then be exposed, and after that step, the unexposed areas and the ink both may be removed, and the process steps continued as described hereinabove.

For any of the processes, additional steps may be employed such as pre-etching or post-etching acid baths, water soaks, and neutralizations, additional layers of metals such as gold, nickel or tin may be plated, and additional soldering steps may be used to form a final product.

Circuits made by the process of the invention are useful in the full range of electronic devices.

EXAMPLES

An assortment of Toray WF 80 II flexographic and letterpress plates were obtained. These were exposed as recommended by the manufacturer, in a contact vacuum frame with a negative film containing circuit test elements with line/space pair dimensions from 4 mils to 32 mils. These plates were mounted on a block of aluminum in the first station of a "Little Joe" ink tester (Little Joe Industries, Belle Mead, N.J.) and inked as recommended by the manufacturer.

The substrate, including the photopolymer resist and optionally the cover coat, was taped to the rolling drum, and patterned by being rolled across the surface of the inked printing plate. The inked sample was then cured. It was placed in a Fusion UV benchtop processor and exposed using a fusion F300W, 6 inch D lamp, at 45 ft/min. The radiation was focused at the sample plane. After the sample was exposed to UV light, the coversheet was removed from the sample and the photoresist image was developed in a 0.75% $NaCO_3$ solution for approximately one minute. The sample was then copper plated in a 100 gm/liter $CuSO_4$ copper plating bath with 185 gm/liter $H_2SO_4$ at 20 amps/square ft for 1 hour total resistance time. The polyimide carrier film was then milled in a 45%KOH bath at a temperature of approximately 93° C. for 3 minutes followed by stripping of the photoresist in 3% KOH at approximately 62° C. The final part was then rinsed and dried.

Inks used included a black UV-cured letterpress ink formulated to have minimum particle size from the Louis O. Wemeke Company (Plymouth, Minn.), and two custom UV cured ink formulated as follows:

| Ink 1 | Ink 2 | Ingredients | Source |
|---|---|---|---|
| — | 74 parts | Sarbox ™ SB 500 E 50 | (Sartomer, Total) |
| 75 parts | — | Sarbox ™ SB 510 E 35 | (Sartomer, Total) |
| 12 parts | 18 parts | CDI 15858, | (CDI Dispersions) |
| 7 parts | 8 parts | Darocure ™ 1173 | (Ciba Specialty Chemicals) |
| 5 parts | — | Sartomer ™ SR 506A | (Sartomer, Total) |

What is claimed is:

1. A process for fabricating a flexible printed circuit with at least one etched or plated feature on each major surface of said flexible circuit, comprising the steps of:
   (a) providing an input material including a dielectric substrate and at least one conductive base layer, said input material having two major surfaces,
   (b) laminating a photoresist having a cover sheet fixedly attached thereover onto at least one major surface of said input material, and
   (c) printing a mask pattern onto said cover sheet, wherein said mask pattern defines the design of the resulting circuit.

2. A process according to claim 1 wherein the printing is accomplished by means of a continuous method selected from flexographic and letterpress printing.

3. A process according to claim 1 wherein the printing is accomplished by means of offset lithography.

4. A process according to claim 1 wherein the printing is accomplished by means of rotary gravure printing.

5. A process according to claim 1 wherein the printing is accomplished by means of waterless lithography.

6. A process according to claim 1 wherein the printing is accomplished by means of a method selected from ink jet and xerographic printing.

7. A process according to claim 1 wherein the input material also includes a metal oxide layer on at least one side of the dielectric substrate.

8. A process according to claim 1 wherein a photoresist having a cover sheet thereover is laminated to both of said major surfaces of said input material.

9. A process for fabricating a flexible printed circuit with at least one etched or plated feature on each major surface of said flexible circuit, comprising the steps of:
   (a) providing an input material including a dielectric substrate and at least one conductive base layer, said input material having two major surfaces, (b) laminating a photoresist onto at least one major surface of said input material, said photoresist having a cover sheet thereover, (c) removing said cover sheet, and (d) printing a mask pattern onto directly onto said photoresist, wherein said mask pattern defines the design of the resulting circuit.

10. A process according to claim 9 wherein the printing is accomplished by means of a continuous method selected from flexographic and letterpress printing.

11. A process according to claim 9 wherein the printing is accomplished by means of offset lithography.

12. A process according to claim 9 wherein the printing is accomplished by means of rotary gravure printing.

13. A process according to claim 9 wherein the printing is accomplished by means of waterless lithography.

14. A process according to claim 9 wherein the printing is accomplished by means of a method selected from ink jet and xerographic printing.

15. A process according to claim 9 wherein the input material also includes a metal oxide layer on at least one side of the dielectric substrate.

16. A process according to claim 9 wherein a photoresist having a cover sheet thereover is laminated to both of said major surfaces of said input material.

* * * * *